US010788521B2

(12) United States Patent
Ho et al.

(10) Patent No.: US 10,788,521 B2
(45) Date of Patent: Sep. 29, 2020

(54) RESISTIVE ENVIRONMENTAL SENSOR AND RESISTIVE ENVIRONMENTAL SENSOR ARRAY

(71) Applicant: Winbond Electronics Corp., Taichung (TW)

(72) Inventors: Yu-Hsuan Ho, Taichung (TW); Ming-Chih Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 121 days.

(21) Appl. No.: 15/786,610

(22) Filed: Oct. 18, 2017

(65) Prior Publication Data

US 2018/0136266 A1    May 17, 2018

(30) Foreign Application Priority Data

Oct. 19, 2016    (CN) .......................... 2016 1 0908612

(51) Int. Cl.
*G01R 27/14*    (2006.01)
*H01L 29/41*    (2006.01)
(Continued)

(52) U.S. Cl.
CPC .............. *G01R 27/14* (2013.01); *G01J 1/429* (2013.01); *G01J 5/046* (2013.01); *G01J 5/10* (2013.01);
(Continued)

(58) Field of Classification Search
CPC .......... G01R 27/14; H01L 29/41; G01J 5/046; G01J 5/20; G01J 5/10; G01J 1/429;
(Continued)

(56) References Cited

U.S. PATENT DOCUMENTS 6,274,920 B1 *   8/2001   Park ....................... H01L 27/08
                                                            257/277
9,018,060 B2 *   4/2015   Gryska ................ G01N 27/226
                                                            257/E21.351
(Continued)

FOREIGN PATENT DOCUMENTS

CN           1802552         7/2006
CN          104977326       10/2015
(Continued)

OTHER PUBLICATIONS

Yu-Hsuan Ho, et al, "Particle Sensing Device and Electronic Apparatus Having the Same," Unpublished U.S. Appl. No. 15/473,645, Filed on Mar. 30, 2017, The specification, claims, and the drawings of the unpublished pending U.S. application have been stored in the Image File Wrapper (IFW) system.
(Continued)

*Primary Examiner* — Jeff W Natalini
(74) *Attorney, Agent, or Firm* — JCIPRNET

(57) ABSTRACT

A resistive environmental sensor including an electrode stack and a sensing layer is provided. The electrode stack includes a first electrode layer, a second electrode layer, and a dielectric layer disposed between the first and second electrode layers, wherein the electrode stack includes a side surface, and the first and second electrode layers are exposed on the side surface of the electrode stack. The sensing layer is disposed on the side surface of the electrode stack, and the sensing layer s in contact with the first and second electrode layers. An environmental variation is inspected by sensing a resistance variation of the sensing layer that is between the first and second electrode layers. The above-mentioned sensor is capable of sensing gases, light, humidity, temperature, and so on. The above-mentioned sensor has advantages of low resistivity and good sensitivity.

15 Claims, 9 Drawing Sheets

(51) Int. Cl.
*G01J 5/04* (2006.01)
*G01J 5/20* (2006.01)
*G01J 1/42* (2006.01)
*G01J 5/10* (2006.01)
*G01N 27/12* (2006.01)
*G01J 5/22* (2006.01)
*G01N 27/04* (2006.01)

(52) U.S. Cl.
CPC ............... *G01J 5/20* (2013.01); *H01L 29/41* (2013.01); *G01J 5/22* (2013.01); *G01N 27/041* (2013.01); *G01N 27/121* (2013.01); *G01N 27/128* (2013.01)

(58) Field of Classification Search
CPC .. G01N 27/128; G01N 27/121; G01N 27/041; G01D 5/12
See application file for complete search history.

(56) References Cited

U.S. PATENT DOCUMENTS

| | | | | |
|---|---|---|---|---|
| 9,817,533 | B2* | 11/2017 | Bulea | G06F 3/044 |
| 2011/0120866 | A1 | 5/2011 | Lee et al. | |
| 2013/0261964 | A1* | 10/2013 | Goldman | G01C 21/12 |
| | | | | 701/500 |
| 2015/0200348 | A1* | 7/2015 | Lee | G01J 5/024 |
| | | | | 257/467 |
| 2016/0025517 | A1 | 1/2016 | Giedd et al. | |
| 2017/0031217 | A1* | 2/2017 | Jung | G02F 1/1345 |
| 2017/0187541 | A1* | 6/2017 | Sundaresan | H04L 67/12 |
| 2019/0006574 | A1* | 1/2019 | Mardilovich | B41J 2/14233 |

FOREIGN PATENT DOCUMENTS

| | | |
|---|---|---|
| CN | 105609501 | 5/2016 |
| TW | 201222856 | 6/2012 |

OTHER PUBLICATIONS

"Office Action of China Counterpart Application," dated Sep. 11, 2019, p. 1-p. 11.

"Office Action of China Counterpart Application", dated May 8, 2020, p. 1-p. 14.

* cited by examiner

RESISTIVE ENVIRONMENTAL SENSOR AND RESISTIVE ENVIRONMENTAL SENSOR ARRAY

CROSS-REFERENCE TO RELATED APPLICATION

This application claims the priority benefit of China application serial no. 201610908612.X, filed on Oct. 19, 2016. The entirety of the above-mentioned patent application is hereby incorporated by reference herein and made a part of this specification.

BACKGROUND

Technical Field

The embodiment of the invention relates to a sensor, and particularly relates to a resistive environmental sensor.

Description of Related Art

With the development of industry in recent years, since people pay more attention to their own health and environmental protection year after year, the related sensing technologies (such as gas sensing technology, ultraviolet light sensing technology, temperature sensing technology, and humidity sensing technology) have been gradually developed. To reduce a sensor area and increase sensitivity, the conventional sensors often use an interdigitated electrode. However, taking a conventional sensor with one hundred pairs of the interdigitated electrodes as an example, resistivity of the sensor is still too high (about hundreds of MΩ level), thereby resulting in poor sensitivity of the sensor. Furthermore, a configuration of the interdigitated electrode still requires a certain area, which is not conducive to the application in the miniaturized sensors. Thus, how to effectively reduce the resistivity of the sensor, improve the sensitivity of the sensor, and miniaturize the sensor is one of the issues to be solved by researchers recently.

SUMMARY

The embodiment of the invention provides a resistive environmental sensor having advantages of low resistivity, good sensitivity, and easily miniaturization.

One embodiment of the invention provides a resistive environmental sensor including an electrode stack and a sensing layer. The electrode stack includes a first electrode layer, a second electrode layer, and a dielectric layer disposed between the first electrode layer and the second electrode layer, wherein the electrode stack has a side surface, and the first electrode layer and the second electrode layer are exposed on the side surface of the electrode stack. The sensing layer is disposed on the side surface of the electrode stack, and the sensing layer is in contact with the first electrode layer and the second electrode layer. An environmental variation is inspected by sensing a resistance variation of the sensing layer between the first electrode layer and the second electrode layer.

Another embodiment of the invention also provides a resistive environmental sensor array including a circuit board and a plurality of sensing layers. The circuit board includes a first conductive pattern, a second conductive pattern, and a dielectric layer disposed between the first conductive pattern and the second conductive pattern. The first conductive pattern includes a plurality of separated first electrode layers. The second conductive pattern includes a plurality of separated second electrode layers. The circuit board has a plurality of grooves exposing the first electrode layers and the second electrode layers. Each of the sensing layers covers at least a part of a corresponding one of the grooves, and the sensing layers are in contact with the first electrode layers and the second electrode layers. An environmental variation is inspected by sensing a resistance variation of the sensing layer between the first electrode layer and the second electrode layer.

According to an embodiment of the invention, a thickness of the dielectric layer is between 0.01 micrometer and 100 micrometers.

According to an embodiment of the invention, the sensing layer is in contact with the dielectric layer.

According to an embodiment of the invention, an air gap is between the sensing layer and the dielectric layer.

According to an embodiment of the invention, an angle is included between the side surface of the electrode stack and a thickness direction of the electrode stack, and the angle is between 30 degrees and 60 degrees.

According to an embodiment of the invention, the sensing layer is formed on the side surface of the electrode stack by a three-dimensional printing process, and the sensing layer includes a silicon layer, a carbon nanotube layer, a graphene layer, a graphene oxide layer, a zinc oxide layer, a tin dioxide layer, an indium oxide ($InO_x$, $x>0$) layer, a tungsten trioxide layer, a magnesium oxide layer, a titanium dioxide layer, a ferric oxide layer, a nickel layer, a copper layer, or a gold cluster layer (Au cluster layer).

According to an embodiment of the invention, the resistive environmental sensor may further include at least one groove, and a surface of the at least one groove is the side surface of the electrode stack.

Based on the above, since the first electrode layer and the second electrode layer are separated by the dielectric layer, and the distance (or spacing) between the first electrode layer and the second electrode layer is determined by the thickness of the dielectric layer, a micron-level electrode spacing may be easily achieved by properly controlling the thickness of the dielectric layer. In the case that the electrode spacing may be effectively reduced, the resistive environmental sensor or the resistive environmental sensor array of the invention has advantages of low resistivity, good sensitivity, and easily miniaturization.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
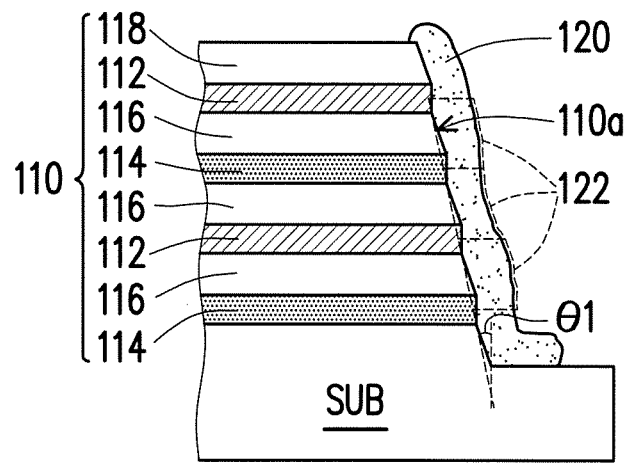
FIG. 1 and FIG. 3 are schematic cross-sectional views of a resistive environmental sensor according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

First Embodiment

Figure 2:
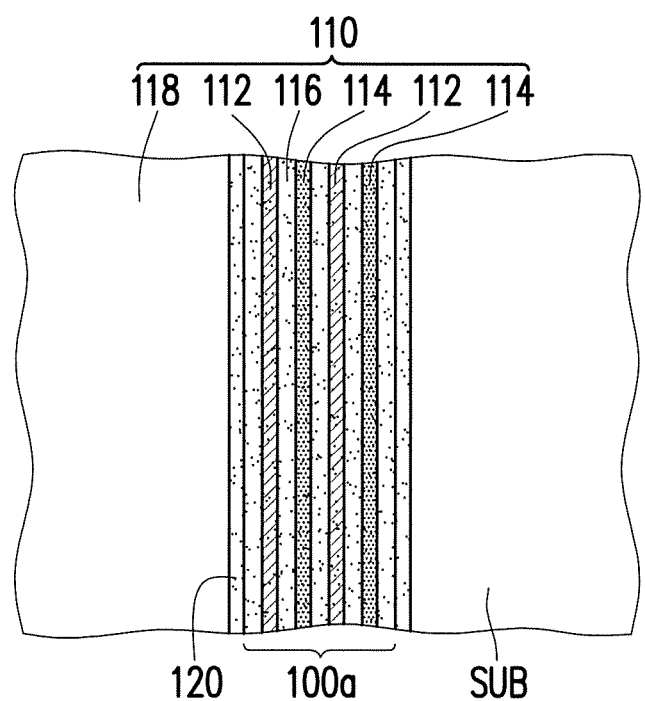
FIG. 2 is a schematic top view of a first electrode layer, a second electrode layer, a dielectric layer, and a sensing layer in FIG. 1.
Figure 3:
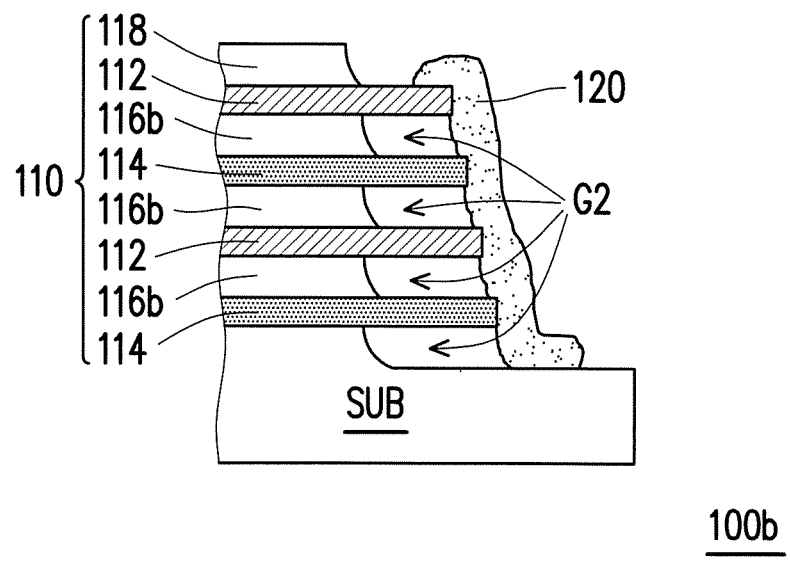

FIG. 1 and FIG. 3 are schematic cross-sectional views of a resistive environmental sensor according to a first embodiment of the invention, and FIG. 2 is a schematic top view of a first electrode layer, a second electrode layer, a dielectric layer, and a sensing layer in FIG. 1.

Referring to FIG. 1 and FIG. 2, a resistive environmental sensor 100 of the embodiment includes an electrode stack 110 and a sensing layer 120. The electrode stack 110 includes at least one first electrode layer 112, at least one second electrode layer 114, and at least one dielectric layer 116 disposed between the first electrode layer 112 and the second electrode layer 114, wherein the electrode stack 110 has a side surface 110a, and the first electrode layer 112 and the second electrode layer 114 are exposed on the side surface 110a of the electrode stack 110. The sensing layer 120 is disposed on the side surface 110a of the electrode stack 110, and the sensing layer 120 is in contact with the first electrode layer 112 and the second electrode layer 114.

As shown in FIG. 1 and FIG. 2, the electrode stack 110 is stacked on a substrate SUB, for example. The electrode stack 110 includes a plurality of the first electrode layers 112 and a plurality of the second electrode layers 114 alternately stacked, and a plurality of the dielectric layers 116 each disposed between any two adjacent first electrode layer 112 and second electrode layer 114, so as to separate the first electrode layer 112 and the second electrode layer 114 adjacent to each other. In the embodiment, numbers of the first electrode layer 112, the second electrode layer 114, and the dielectric layer 116 may be changed according to actual design requirements.

The aforementioned electrode stack 110 and the substrate SUB may be manufactured by a process for build-up multilayer printed boards or a semiconductor process, and the sensing layer 120 may be formed on the side surface 110a of the electrode stack 110 by a three-dimensional printing (3D-printing) process. In some embodiments, an ink type or aerosol sensing material may be printed or deposited on the side surface 110a of the electrode stack 110 by a non-contact printing method, so as to form the sensing layer 120 which is conformal with the side surface 110a. Since an electrode spacing between the first electrode layer 112 and the second electrode layer 114 has been controlled quite precisely through the thickness of the dielectric layer 116, the printing of the sensing layer 120 does not need to be controlled very precisely. In other words, the sensing layer 120 has a large process window in production. Accordingly, a yield rate and throughput of the resistive environmental sensor 100 may be effectively enhanced.

In the embodiment, the aforementioned sensing layer 120 may be a gas sensing layer, a light sensing layer, a humidity sensing layer, or a temperature sensing layer. For example, the sensing layer 120 includes a silicon layer, a carbon nanotube layer, a graphene layer, a graphene oxide layer, a zinc oxide layer, a tin dioxide layer, an indium oxide ($InO_x$, x>0) layer, a tungsten trioxide layer, a magnesium oxide layer, a titanium dioxide layer, a ferric oxide layer, a nickel layer, a copper layer, or a gold cluster layer (Au cluster layer). It should be noted that, the silicon layer, the carbon nanotube layer, the graphene layer, the graphene oxide layer, the zinc oxide layer, the tin dioxide layer, the indium oxide ($InO_x$, x>0) layer, the tungsten trioxide layer, the magnesium oxide layer, the titanium dioxide layer, the ferric oxide layer, and the Au cluster layer may function as the gas sensing layer. The zinc oxide layer, the tin dioxide layer, the indium oxide ($InO_x$, x>0) layer, the magnesium oxide layer, and the titanium dioxide layer may function as an ultraviolet light sensing layer. The silicon layer, the graphene layer, the graphene oxide layer, the zinc oxide layer, the tin dioxide layer, and the titanium dioxide layer may function as the humidity sensing layer. The silicon layer, the nickel layer, and the copper layer may function as the temperature sensing layer.

In the embodiment, the side surface 110a of the electrode stack 110 may be an inclined side surface having an angle $\theta 1$ with respect to the thickness direction of the electrode stack 110 as shown in FIG. 1. In other embodiments, the side surface 110a of the electrode stack 110 may be a vertical side surface substantially coinciding with the thickness direction of the electrode stack 110. When the side surface 110a of the electrode stack 110 is the inclined side surface (for example, the angle $\theta 1$ may be between 30 degrees and 60 degrees), the sensing layer 120 is formed on the side surface 110a of the electrode stack 110 by the non-contact printing method easily. When the side surface 110a of the electrode stack 110 is the vertical side surface, the sensing layer 120 may be printed on the side surface 110a of the electrode stack 110 by changing the printing angle, such as changing installing positions of a nozzle angle and/or the electrode stack 110.

In the electrode stack 110 of the embodiment, the numbers of the first electrode layer 112 and the second electrode layer 114 are both more than one. During sensing, at least one pair of the first electrode layer 112 and the second electrode layer 114 are selected to measure a resistance variation of the sensing layer 120 between the pair of the first electrode layer 112 and the second electrode layer 114. For example, the first electrode layers 112 may be applied with a first voltage, and the second electrode layers 114 may be applied with a second voltage, such that a required voltage difference between each of the first electrode layers 112 and the second electrode layer 114 adjacent thereto is generated. When the resistive environmental sensor 100 senses a change of a specific target (e.g., temperature) in the environment, the aforementioned voltage difference will change. According to the embodiment, the sensing layer 120 is divided into a plurality of sensing regions 122 distributed along with the side surface 110a according to each of the first electrode layers 112 and the second electrode layer 114 adjacent thereto. In other words, the selected pair of the first electrode layer 112 and the second electrode layer 114 are the first electrode layer 112 and the second electrode layer 114 adjacent to each other, and a length of the sensing region 122 is determined based on a distance between the first electrode layer 112 and the second electrode layer 114 along the side surface 110a (i.e., electrode spacing). The electrode spacing of the first electrode layer 112 and the second electrode layer 114 is related to the thickness of the dielectric layer 116. Since the thickness of the dielectric layer 116 may be easily controlled between about 0.01 micrometer and about 100 micrometers, the electrode spacing of the first electrode layer 112 and the second electrode layer 114 may also be easily controlled between 0.01 micrometer and 200 micrometers. In an embodiment, the electrode spacing of the first electrode layer 112 and the second electrode layer 114 is not more than 1 micrometer. Accordingly, a resistance value and area of the resistive environmental sensor 100 may be effectively reduced, so as to improve sensitivity and meet the need of miniaturization.

In other embodiments, the electrode stack 110 may be composed a single first electrode layer 112, a single second electrode layer 114, and a single dielectric layer 116 sandwiched between the first electrode layer 112 and the second electrode layer 114. In other words, the sensing layer 120 only includes a single sensing region 122.

As shown in FIG. 1, the sensing layer 120 of the embodiment is in contact with the dielectric layer 116 directly, and the sensing layer 120 may cover a portion of a top surface of the electrode stack 110, the side surface 110a of the electrode stack 110, and a portion of the substrate SUB.

It should be noted that, the electrode stack 110 in the embodiment may further include a protective layer 118, wherein the protective layer 118 covers the first electrode layer 112, the second electrode layer 114, and the dielectric layer 116, and the sensing layer 120 may partially cover the aforementioned protective layer 118. As shown in FIG. 1, the protective layer 118 may protect the first electrode layer 112, the second electrode layer 114, and the dielectric layer 116 located thereunder, thereby improving the device reliability of the resistive environmental sensor 100.

Then, referring to FIG. 1 and FIG. 3, a resistive environmental sensor 100b in FIG. 3 is similar to the resistive environmental sensor 100 in FIG. 1, and the main difference is that, an air gap G2 is between the sensing layer 120 and a dielectric layer 116b in the resistive environmental sensor 100b, and the sensing layer 120 is not in contact with the protective layer 118 in the resistive environmental sensor 100b. The aforementioned air gap G2 is formed in a patterning process of the dielectric layer 116b. For example, when performing a wet etching process on the dielectric layer 116b, the air gap G2 in the resistive environmental sensor 100b may be formed from an undercut phenomenon occurring on a sidewall of the dielectric layer 116b. Compared with the resistive environmental sensor 100 of FIG. 1, the contact area of the sensing layer 120 and the first electrode layer 112, and the second electrode layer 114 in the resistive environmental sensor 100b of FIG. 3 is increased, thereby providing higher sensitivity.

Second Embodiment

Figure 4:
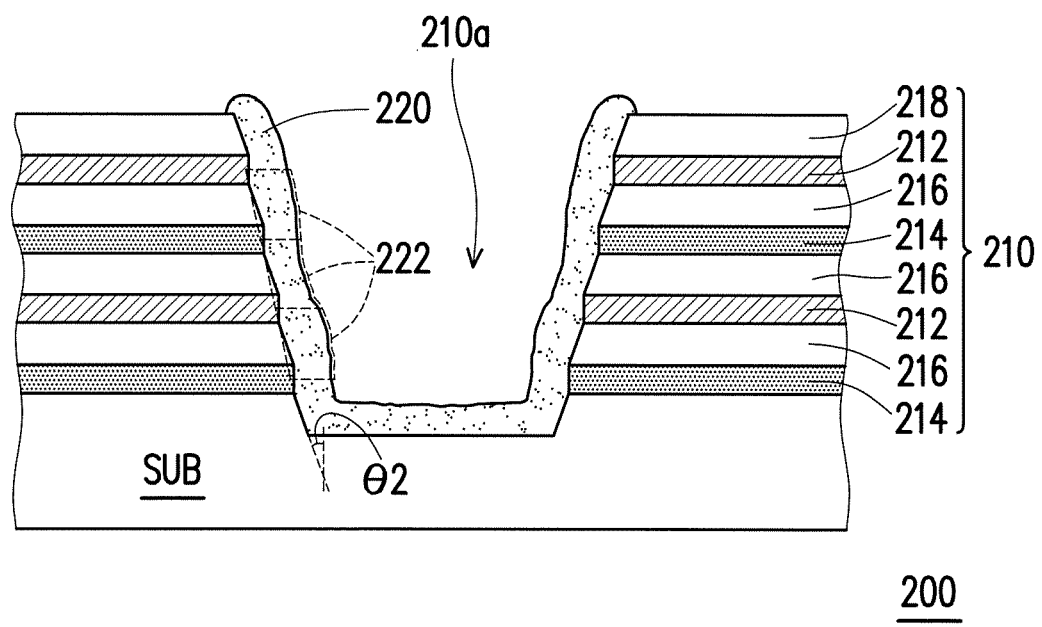
FIG. 4 and FIG. 6 are schematic cross-sectional views of a resistive environmental sensor according to a second embodiment of the invention.
Figure 5:
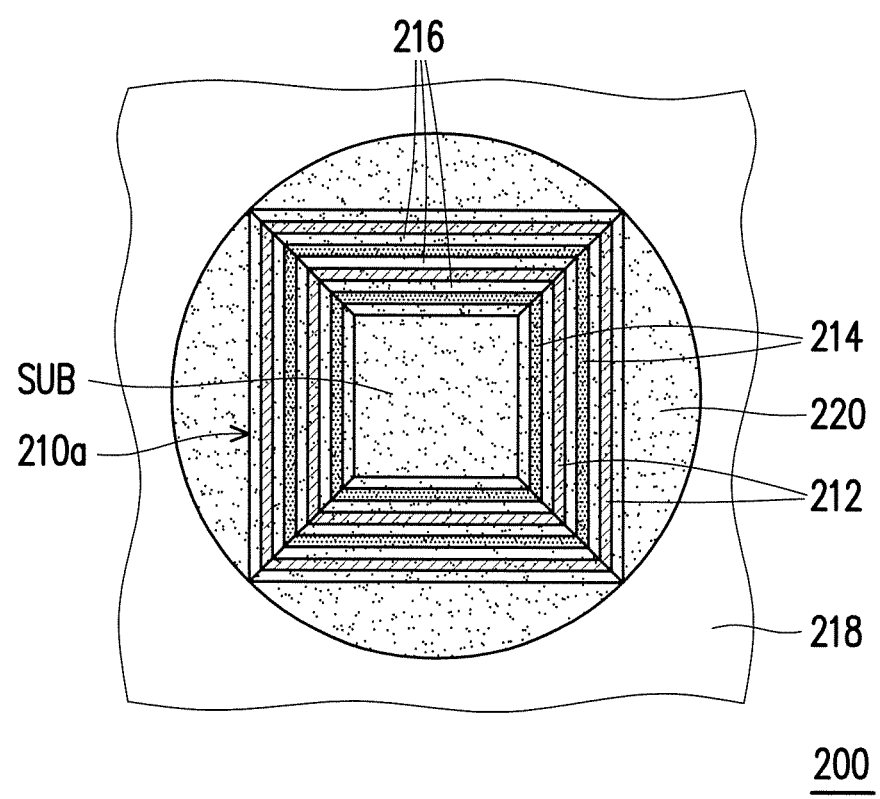
FIG. 5 is a schematic top view of a first electrode layer, a second electrode layer, a dielectric layer, and a sensing layer in FIG. 4.
Figure 6:
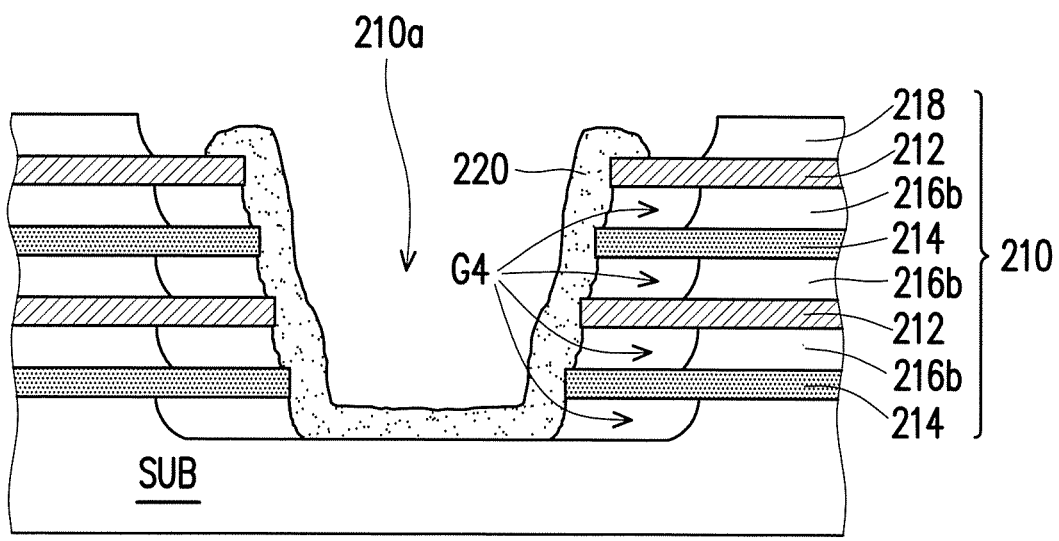

FIG. 4 and FIG. 6 are schematic cross-sectional views of a resistive environmental sensor according to a second embodiment of the invention, and FIG. 5 is a schematic top view of a first electrode layer, a second electrode layer, a dielectric layer, and a sensing layer in FIG. 4.

Referring to FIG. 4 and FIG. 5, a resistive environmental sensor 200 of the embodiment includes a circuit board 210 and a sensing layer 220. The circuit board 210 includes at least one first electrode layer 212, at least one second electrode layer 214, and at least one dielectric layer 216 disposed between the first electrode layer 212 and the second electrode layer 214, wherein the circuit board 210 has at least one groove 210a, so as to expose the first electrode layer 212 and the second electrode layer 214. The sensing layer 220 is disposed in the groove 210a, and the sensing layer 220 is in contact with the first electrode layer 212 and the second electrode layer 214. In the embodiment, detailed description for the sensing layer 220 is similar to the sensing layer 120 in the first embodiment, and is not repeated herein. Detailed descriptions for the first electrode layer 212, the second electrode layer 214, and the dielectric layer 216 of the circuit board 210 are similar to the first electrode layer 112, the second electrode layer 114, and the dielectric layer 116 of the electrode stack 110 respectively, and are not repeated herein.

In the embodiment, the groove 210a has a bottom surface with a shape of a square, a rectangle, a polygon, a circle, or an ellipsoid, for example. The groove 210a is capable of accommodating the sensing layer 220 with a sufficient volume. The embodiment does not limit the volume of the groove 210a.

As shown in FIG. 4 and FIG. 5, the second electrode layer 214, the dielectric layer 216, and the first electrode layer 212 in the circuit board 210 may be sequentially stacked on a substrate SUB. Further, an upper surface of the substrate SUB may be exposed by the groove 210a. In the embodiment, the circuit board 210 includes a plurality of the dielectric layers 216 and a plurality of the first electrode layers 212 and a plurality of the second electrode layers 214 alternately stacked, wherein the dielectric layer 216 is disposed between any two adjacent first electrode layer 212 and second electrode layer 214, so as to separate the first electrode layer 212 and the second electrode layer 214 adjacent to each other. In the embodiment, numbers of the first electrode layer 212, the second electrode layer 214, and the dielectric layer 216 may be changed according to actual design requirements.

The aforementioned circuit board 210 may be manufactured by a build-up multilayer printed board process or a semiconductor process, and the sensing layer 220 may be formed in the groove 210a of the circuit board 210 by a 3D-printing process.

In some embodiments, an ink type or aerosol sensing material may be printed or deposited in the groove 210a of the circuit board 210 by a non-contact printing method, so as to form the sensing layer 220 which is conformal with a profile of the groove 210a. The same as the first embodiment, since the electrode spacing between the first electrode layer 212 and the second electrode layer 214 has been controlled quite precisely through a thickness of the dielectric layer 216, the printing of the sensing layer 220 does not need to be controlled very precisely. In other words, the sensing layer 220 has a large process window in production. Accordingly, a yield rate and throughput of the resistive environmental sensor 200 may be effectively improved.

In the embodiment, the sidewall of the groove 210a may be an inclined sidewall having an angle θ2 with respect to a thickness direction of the substrate SUB as shown in FIG. 4. In other embodiments, the sidewall of the groove 210a may be a vertical sidewall that substantially coincide with the thickness direction of the substrate SUB. When the sidewall of the groove 210a is the inclined sidewall (for example, the angle θ2 is between 30 degrees and 60 degrees), the sensing layer 220 is formed on the sidewall of the groove 210a by the non-contact printing method easily. When the sidewall of the groove 210a is the vertical sidewall, the sensing layer 220 may be printed on the sidewall of the groove 210a by changing the printing angle, such as changing installing positions of a nozzle angle and/or the circuit board 210.

The operation principle of the resistive environmental sensor 200 is similar to that of the resistive environmental sensor 100, and is not repeated. Since the thickness of the dielectric layer 216 may be easily controlled between about 0.01 micrometer and about 100 micrometers, the electrode spacing of the first electrode layer 212 and the second electrode layer 214 may also be easily controlled between about 0.01 micrometer and about 200 micrometers. In an embodiment, the electrode spacing of the first electrode layer 212 and the second electrode layer 214 is not more than 1 micrometer. Accordingly, a resistance value of the resistive environmental sensor 200 and area occupied by the resistive environmental sensor 200 may be effectively reduced, so as to improve sensitivity and meet the need of miniaturization.

In other embodiments, the sensing layer 220 may only include a single sensing region 222.

As shown in FIG. 4, the sensing layer 220 of the embodiment is in contact with the dielectric layer 216 directly, and the sensing layer 220 may cover a portion of a top surface of the circuit board 210, the sidewall of the groove 210a, and a portion of the substrate SUB.

It should be noted that, the circuit board 210 in the embodiment may further include a protective layer 218, wherein the protective layer 218 covers the first electrode layer 212, the second electrode layer 214, and the dielectric layer 216, and the sensing layer 220 may partially cover the aforementioned protective layer 218. As shown in FIG. 4, the protective layer 218 may protect the first electrode layer 212, the second electrode layer 214, and the dielectric layer 216 located thereunder, thereby improving the device reliability of the resistive environmental sensor 200.

Then, referring to FIG. 4 and FIG. 6, a resistive environmental sensor 200b in FIG. 6 is similar to the resistive environmental sensor 200 in FIG. 4, and the main difference is that, an air gap G4 is between the sensing layer 220 and a dielectric layer 216b in the resistive environmental sensor 200b, and the sensing layer 220 is not in contact with the protective layer 218 in the resistive environmental sensor 200b. Compared with the resistive environmental sensor 200 of FIG. 4, the contact area of the sensing layer 220 and the first electrode layer 212, and the second electrode layer 214 in the resistive environmental sensor 200b of FIG. 6 is increased, thereby providing higher sensitivity.

Third Embodiment

Figure 7:
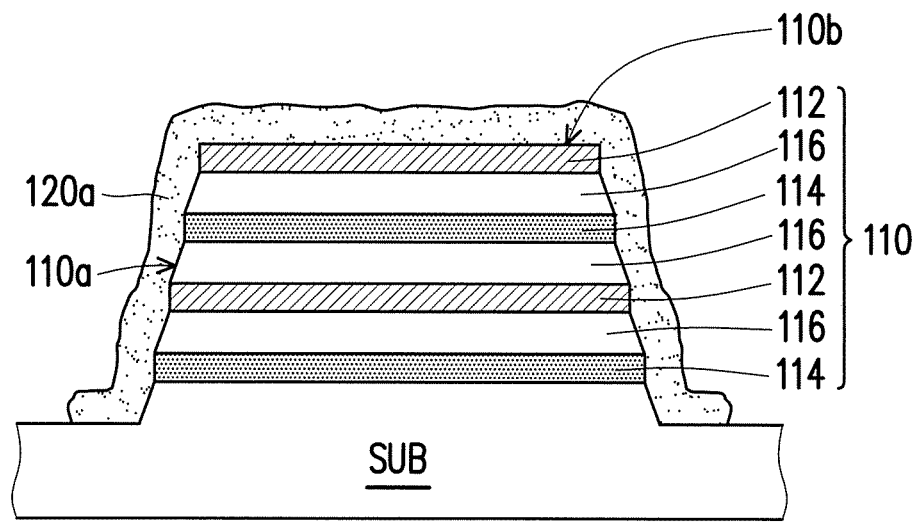
FIG. 7 and FIG. 9 are schematic cross-sectional views of a resistive environmental sensor according to a third embodiment of the invention.
Figure 8:
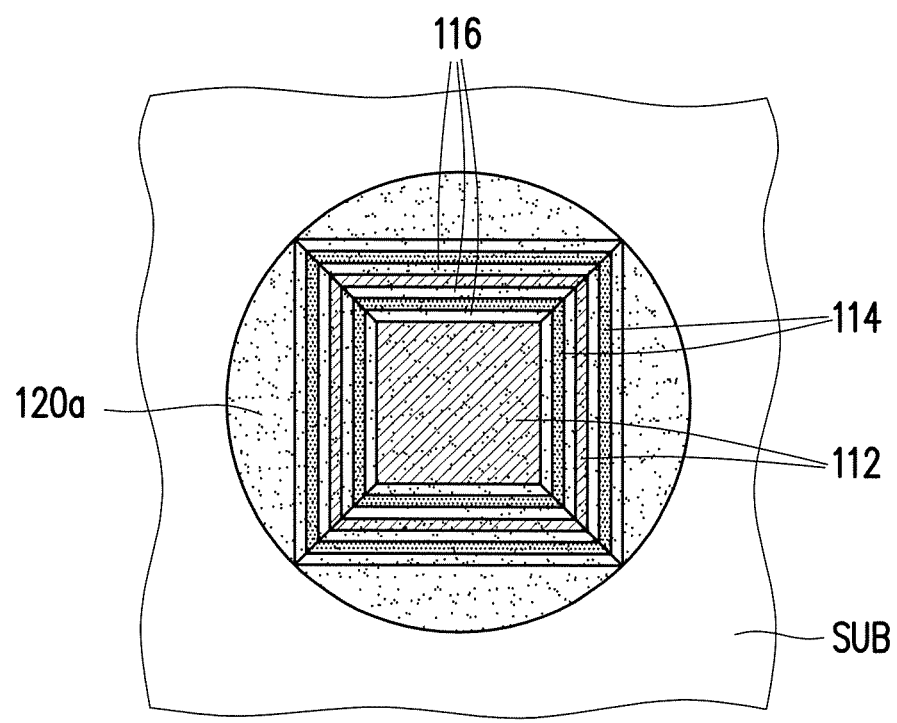
FIG. 8 is a schematic top view of a first electrode layer, a second electrode layer, a dielectric layer, and a sensing layer in FIG. 7.
Figure 9:
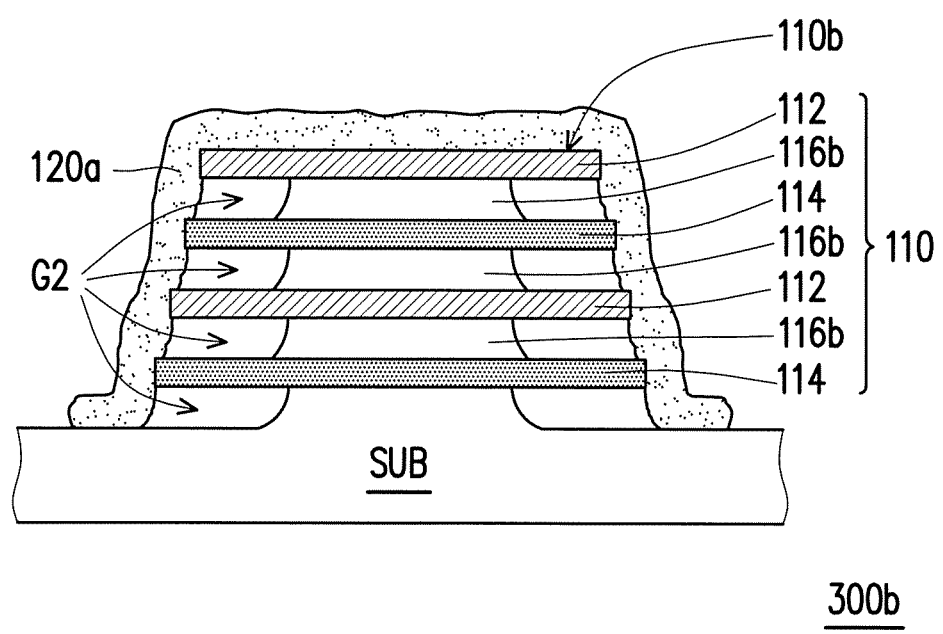

FIG. 7 and FIG. 9 are schematic cross-sectional views of a resistive environmental sensor according to a third embodiment of the invention, and FIG. 8 is a schematic top view of a first electrode layer, a second electrode layer, a dielectric layer, and a sensing layer in FIG. 7.

Referring to FIG. 1 and FIG. 7 to FIG. 9 at the same time, resistive environmental sensors 300 and 300b of the embodiment are similar to the resistive environmental sensors 100 and 100b of the first embodiment respectively, and the main difference is that, the electrode stack 110 in the resistive environmental sensors 300 and 300b is an island structure protruding from the substrate SUB, and a sensing layer 120a covers a top surface 110b and the entire side surface 110a of the electrode stack 110.

In the embodiment, the electrode stack 110 has a bottom surface or a top surface with a shape of a square, a rectangle, a polygon, a circle, or an ellipsoid, for example. The electrode stack 110 is capable of carrying a sufficient sensing layer 120a as a principle. The embodiment does not limit the volume of the electrode stack 110.

It should be noted that, the number of the electrode stack 110 in the embodiment is not limited to one. A plurality of the separated electrode stacks 110 that are arranged in an array on the substrate SUB is also within the scope of the embodiment. In such embodiment (not shown), there are a plurality of grooves between the electrode stacks, and the first electrode layers and the second electrode layers are exposed by the grooves. Therefore, part of each groove is covered by the sensing layer so as to contact the sensing layer with the first electrode layers and the second electrode layers. When the plurality of the electrode stacks 110 arranged in an array on the substrate SUB includes different types of the sensing layers 120a (e.g., at least two of a gas sensing layer, a light sensing layer, a humidity sensing layer, and a temperature sensing layer), the electrode stacks 110 may constitute a resistive environmental sensor array having a composite sensing function.

Fourth Embodiment

Figure 10:
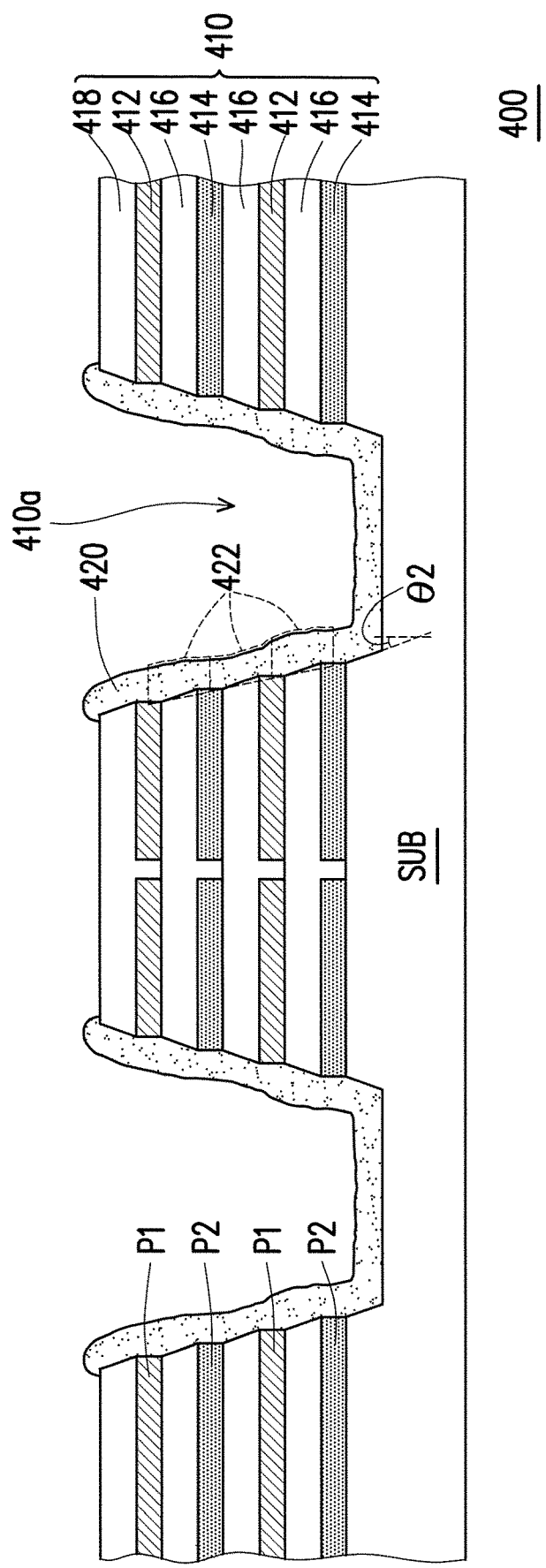
FIG. 10 and FIG. 12 are schematic cross-sectional views of a resistive environmental sensor array according to a fourth embodiment of the invention.
Figure 11:
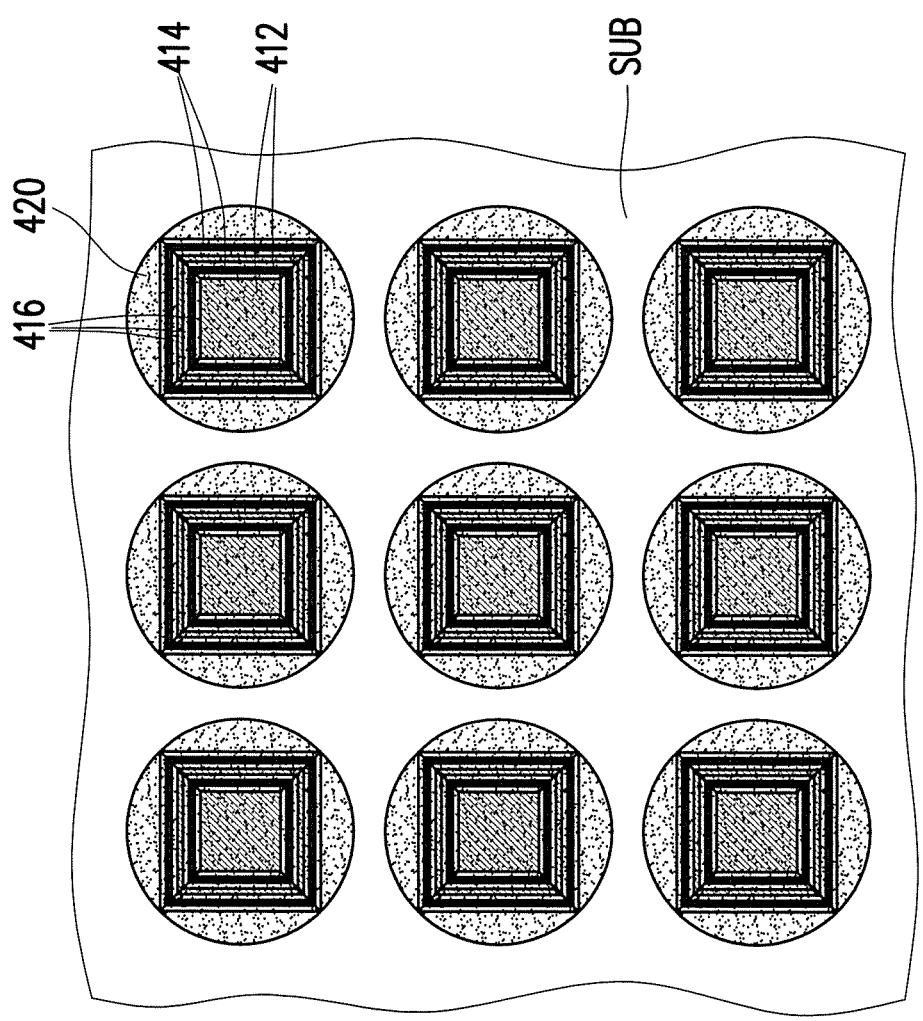
FIG. 11 is a schematic top view of the resistive environmental sensor array in FIG. 10.
Figure 12:
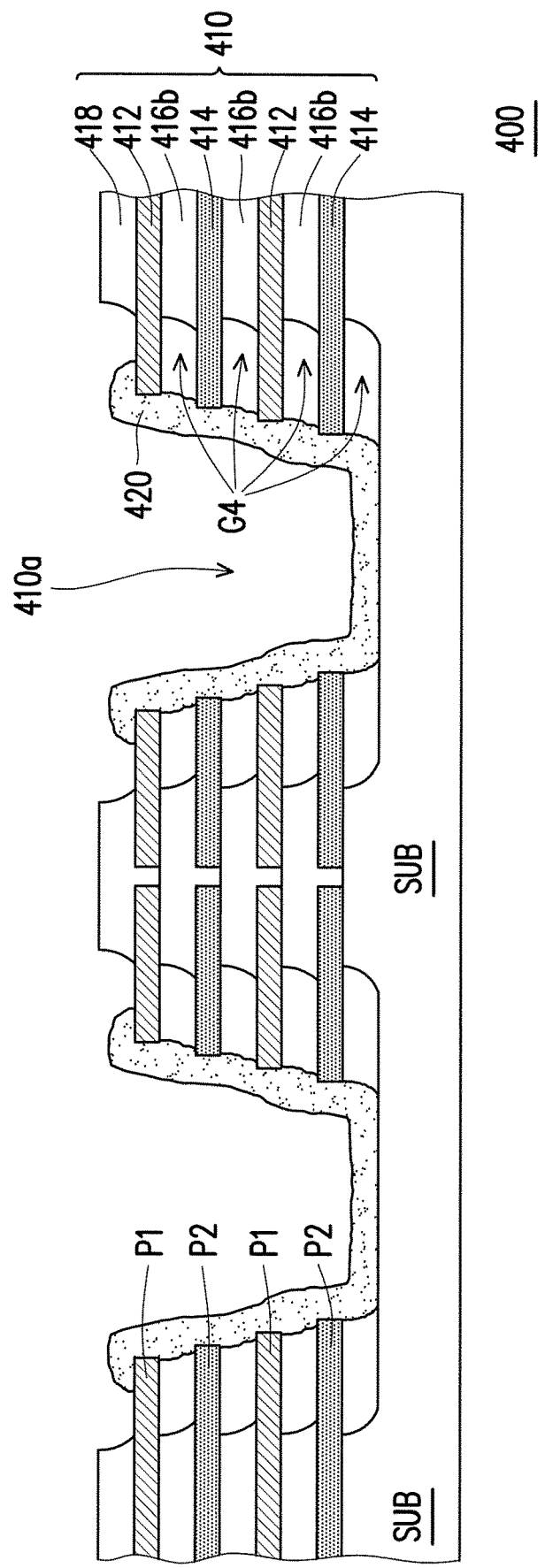

FIG. 10 and FIG. 12 are schematic cross-sectional views of a resistive environmental sensor array according to a fourth embodiment of the invention, and FIG. 11 is a schematic top view of the resistive environmental sensor array in FIG. 10.

Referring to FIG. 10 to FIG. 12, resistive environmental sensor arrays 400 and 400b of the embodiment include a circuit board 410 and a plurality of sensing layers 420. The circuit board 410 includes a first conductive pattern P1, a second conductive pattern P2, and a dielectric layer 416 disposed between the first conductive pattern P1 and the second conductive pattern P2. The first conductive pattern P1 includes a plurality of separated first electrode layers 412. The second conductive pattern P2 includes a plurality of separated second electrode layers 414. The circuit board 410 has a plurality of grooves 410a, so as to expose the first electrode layers 412 and the second electrode layers 414. The sensing layers 420 are located in the grooves 410a, and the sensing layers 420 are in contact with the first electrode layer 412 and the second electrode layer 414.

In the embodiment, the aforementioned grooves 410a are arranged in an array in the circuit board 410, for example, and each of the sensing layers 420 located in different grooves 410a may be at least two of a gas sensing layer, a light sensing layer, a humidity sensing layer, and a temperature sensing layer. When the sensing layers 420 located in the grooves 410a include different types of the sensing layers 420, the resistive environmental sensor array 400 may have composite sensing function. In other embodiments, the material of the sensing layers 420 located in different grooves 410a may be the same.

In summary, in the aforementioned resistive environmental sensor or the resistive environmental sensor array, since the first electrode layer and the second electrode layer are separated by the dielectric layer, and the distance (i.e., electrode spacing) between the first electrode layer and the second electrode layer is determined by the thickness of the dielectric layer, a micron-level electrode spacing may be easily achieved by properly controlling the thickness of the dielectric layer. In the case that the electrode spacing may be effectively reduced, the resistive environmental sensor or the resistive environmental sensor array has low resistivity and good sensitivity.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A resistive environmental sensor, comprising:
    a substrate;
    an electrode stack on a top surface of the substrate, the electrode stack comprising a first electrode layer, a second electrode layer, and a dielectric layer disposed between the first electrode layer and the second electrode layer, wherein the electrode stack has a side surface being oblique to the top surface of the substrate, and the first electrode layer and the second electrode layer are exposed on the side surface of the electrode stack; and
    a sensing layer, disposed on the side surface of the patterned electrode stack, so as to be in contact with the first electrode layer and the second electrode layer, wherein the sensing layer includes a sensing region having an incline surface being oblique to the top surface of the substrate, and a length of the sensing region is determined based on a distance between the first electrode layer and the second electrode layer along the incline surface;
    wherein an environmental variation is inspected by sensing a resistance variation of the sensing region between the first electrode layer and the second electrode layer.

2. The resistive environmental sensor according to claim 1, wherein a thickness of the dielectric layer is between 0.01 micrometer and 100 micrometers.

3. The resistive environmental sensor according to claim 1, wherein the sensing layer is in contact with the dielectric layer.

4. The resistive environmental sensor according to claim 1, wherein an air gap is between the sensing layer and the dielectric layer.

5. The resistive environmental sensor according to claim 1, wherein an angle is included between the side surface of the electrode stack and a thickness direction of the electrode stack, and the angle is between 30 degrees and 60 degrees.

6. The resistive environmental sensor according to claim 1, wherein the sensing layer is formed on the side surface of the electrode stack by a three-dimensional printing process, and the sensing layer comprises a silicon layer, a carbon nanotube layer, a graphene layer, a graphene oxide layer, a zinc oxide layer, a tin dioxide layer, an indium oxide layer, a tungsten trioxide layer, a magnesium oxide layer, a titanium dioxide layer, a ferric oxide layer, a nickel layer, a copper layer, or a gold cluster layer.

7. A resistive environmental sensor, comprising:
    a substrate;
    an electrode stack on a top surface of the substrate, the electrode stack comprising a first electrode layer, a second electrode layer, and a dielectric layer disposed between the first electrode layer and the second electrode layer, wherein the electrode stack has a side surface being oblique to the top surface of the substrate, and the first electrode layer and the second electrode layer are exposed on the side surface of the electrode stack; and
    a sensing layer, disposed on the side surface of the electrode stack, so as to be in contact with the first electrode layer and the second electrode layer;
    wherein an environmental variation is inspected by sensing a resistance variation of the sensing layer between the first electrode layer and the second electrode layer,
    wherein an air gap is between the first electrode layer and the second electrode layer, and the air gap is between the sensing layer and the dielectric layer.

8. A resistive environmental sensor array, comprising:
    a circuit board, comprising a substrate, a first conductive pattern, a second conductive pattern, and a dielectric layer disposed between the first conductive pattern and the second conductive pattern, the first conductive pattern comprising a plurality of separated first electrode layers, the second conductive pattern comprising a plurality of separated second electrode layers, wherein the circuit board has a plurality of grooves having side surfaces being oblique to the top surface of the substrate, so as to expose the first electrode layers and the second electrode layers; and
    a plurality of sensing layers each covering at least a part of a corresponding one of the grooves, so as to be in contact with the first electrode layers and the second electrode layers, wherein each of the plurality of sensing layers includes a plurality of sensing regions each having an incline surface being oblique to the top surface of the substrate;
    wherein an environmental variation is inspected by sensing a resistance variation of the sensing region between the first electrode layer and the second electrode layer.

9. The resistive environmental sensor array according to claim 8, wherein a thickness of each of the dielectric layers is between 0.01 micrometer and 100 micrometers.

10. The resistive environmental sensor array according to claim 8, wherein the sensing layers are in contact with the dielectric layer.

11. The resistive environmental sensor array according to claim 8, wherein an air gap is between each of the sensing layers and the dielectric layer.

12. The resistive environmental sensor array according to claim 8, wherein the sensing layers is formed in the grooves by a three-dimensional printing process, and each of the sensing layers comprises a silicon layer, a carbon nanotube layer, a graphene layer, a graphene oxide layer, a zinc oxide layer, a tin dioxide layer, an indium oxide layer, a tungsten trioxide layer, a magnesium oxide layer, a titanium dioxide layer, a ferric oxide layer, a nickel layer, a copper layer, or a gold cluster layer.

13. The resistive environmental sensor array according to claim 8, wherein the sensing layers comprise at least two of a gas sensing layer, a light sensing layer, a humidity sensing layer, and a temperature sensing layer.

14. The resistive environmental sensor array according to claim 8, wherein the plurality of sensing layers are located in the grooves.

15. The resistive environmental sensor array according to claim 8, wherein the first electrode layers and the second electrode layers, and the dielectric layer constituting a plurality of island structures, and the plurality of sensing layers cover top surfaces and the entire side surfaces of the plurality of island structures.

* * * * *